US011451188B2

(12) United States Patent
Almy et al.

(10) Patent No.: US 11,451,188 B2
(45) Date of Patent: Sep. 20, 2022

(54) BUILDING INTEGRATED PHOTOVOLTAIC SYSTEM WITH GLASS PHOTOVOLTAIC TILES

(71) Applicant: Tesla, Inc., Austin, TX (US)

(72) Inventors: Charles Bernardo Almy, Berkeley, CA (US); Brian Edward Atchley, Petaluma, CA (US); Garret Anthony Bautista, El Cerrito, CA (US)

(73) Assignee: Tesla, Inc., Austin, TX (US)

( * ) Notice: Subject to any disclaimer, the term of this patent is extended or adjusted under 35 U.S.C. 154(b) by 87 days.

(21) Appl. No.: 16/990,248

(22) Filed: Aug. 11, 2020

(65) Prior Publication Data

US 2020/0373876 A1     Nov. 26, 2020

Related U.S. Application Data

(63) Continuation of application No. 15/662,241, filed on Jul. 27, 2017, now Pat. No. 10,778,139.
(Continued)

(51) Int. Cl.
*H02S 20/25*     (2014.01)
*H02S 40/34*     (2014.01)
(Continued)

(52) U.S. Cl.
CPC .............. *H02S 20/25* (2014.12); *H01L 31/02* (2013.01); *H01L 31/048* (2013.01);
(Continued)

(58) Field of Classification Search
None
See application file for complete search history.

(56) References Cited

U.S. PATENT DOCUMENTS 4,321,416 A     3/1982 Tennant
6,294,724 B1    9/2001 Sasaoka et al.
(Continued)

FOREIGN PATENT DOCUMENTS

CN      1811099 A  *  8/2006
CN    103812433 A  *  5/2014  ............. H02S 40/32
(Continued)

OTHER PUBLICATIONS

International Preliminary Report on Patentability received for PCT Patent Application No. PCT/US2017/058342, dated May 9, 2019, 10 pages.
(Continued)

*Primary Examiner* — Shannon M Gardner
(74) *Attorney, Agent, or Firm* — Dentons US LLP

(57) ABSTRACT

Building integrated photovoltaic (BIPV) systems provide for solar panel arrays with improved aesthetics and efficiency that can replace a conventional roof surface structure. These BIPV systems can utilize photovoltaic PV roof tiles defined as glass tiles having photovoltaic elements embedded or incorporated into the body of the roof tile. Such PV roof tiles can include one or more lapping features for interfacing with adjacent tiles and features for electrically connecting multiples tiles within a course to an external power optimizer. Such PV roof tiles can utilize stamped glass that is stamped to define these features within an integrated glass tile and can further include texture, striations on the glass tile and/or color matched back layers or various other components to obscure visibility of any embedded solar cells and provide a more pleasing appearance.

19 Claims, 11 Drawing Sheets

Related U.S. Application Data

(60) Provisional application No. 62/413,893, filed on Oct. 27, 2016.

(51) Int. Cl.
*H01L 31/02* (2006.01)
*H01L 31/048* (2014.01)
*H02S 40/36* (2014.01)

(52) U.S. Cl.
CPC .......... *H01L 31/0488* (2013.01); *H02S 40/34* (2014.12); *H02S 40/36* (2014.12); *Y02A 30/60* (2018.01); *Y02B 10/10* (2013.01)

(56) References Cited

U.S. PATENT DOCUMENTS

| | | |
|---|---|---|
| 6,360,497 B1 | 3/2002 | Nakazima et al. |
| 6,453,629 B1 | 9/2002 | Nakazima et al. |
| 6,489,552 B2 | 12/2002 | Yamawaki et al. |
| 6,506,970 B2 | 1/2003 | Yamawaki |
| 6,928,775 B2 | 8/2005 | Banister |
| 7,858,874 B2 | 12/2010 | Ruskin et al. |
| 8,209,920 B2 | 7/2012 | Krause et al. |
| 8,209,938 B2 | 7/2012 | Gaudreau et al. |
| 8,471,141 B2 | 6/2013 | Stancel et al. |
| 8,613,169 B2 | 12/2013 | Sherman et al. |
| 8,695,289 B2 | 4/2014 | Koch et al. |
| 8,898,970 B2 | 12/2014 | Jenkins et al. |
| 9,068,762 B2 | 6/2015 | Noton |
| 9,184,310 B2 | 11/2015 | Keenihan et al. |
| 9,349,892 B2 | 5/2016 | Park |
| 9,602,046 B2 | 3/2017 | Reese et al. |
| 9,634,168 B2 | 4/2017 | Laia et al. |
| 9,653,634 B2 | 5/2017 | Sherman |
| 2008/0178928 A1 | 7/2008 | Warfield et al. |
| 2008/0289272 A1 | 11/2008 | Flaherty et al. |
| 2009/0000222 A1 | 1/2009 | Kalkanoglu et al. |
| 2009/0159118 A1 | 6/2009 | Kalkanoglu et al. |
| 2010/0162638 A1 | 7/2010 | Hunt |
| 2010/0180523 A1 | 7/2010 | Lena et al. |
| 2013/0067836 A1 | 3/2013 | Sherman |
| 2015/0136206 A1 | 5/2015 | Paul |
| 2017/0005610 A1 | 1/2017 | Sabban |
| 2018/0123504 A1 | 5/2018 | Almy et al. |

FOREIGN PATENT DOCUMENTS

| | | |
|---|---|---|
| EP | 2093807 A2 | 8/2009 |
| EP | 2216829 A1 | 8/2010 |
| JP | 2001-227109 A | 8/2001 |
| WO | 2009/062178 A2 | 5/2009 |
| WO | 2009/137347 A2 | 11/2009 |

OTHER PUBLICATIONS

Final Office Action received for U.S. Appl. No. 15/662,241, dated Oct. 21, 2019, 9 pages.

International Search Report and Written Opinion received for PCT Patent Application No. PCT/US2017/058342, dated Feb. 22, 2018, 13 pages.

Non-Final Office Action received for U.S. Appl. No. 15/662,241, dated Apr. 5, 2019, 9 pages.

Notice of Allowance received for U.S. Appl. No. 15/662,241, dated Aug. 19, 2020, 3 pages.

Notice of Allowance received for U.S. Appl. No. 15/662,241, dated May 8, 2020, 7 pages.

Korody Nicholas, "Say goodbye to clunky solar panels, and hello to Tesla's sleek new glass solar rooftiles", Online Available at:—<https://archinect.com/news/article/149975987/say-goodbye-to-clunky-solar-panels-and-hello-to-tesla-s-sleek-new-glass-solar-roof-tiles>, Oct. 31, 2016, 4 pages.

\* cited by examiner

BUILDING INTEGRATED PHOTOVOLTAIC SYSTEM WITH GLASS PHOTOVOLTAIC TILES

CROSS-REFERENCE TO RELATED APPLICATIONS

This application is a continuation of U.S. patent application Ser. No. 15/662,241, filed Jul. 27, 2017, which claims the benefit of priority of U.S. Provisional Application No. 62/413,893, filed Oct. 27, 2016, the entire contents of which are incorporated herein by reference in their entirety.

This generally relates to U.S. Non-Provisional application Ser. No. 15/399,712, filed Jan. 5, 2017; the entire contents of which are incorporated herein by reference in their entirety for all purposes.

TECHNICAL FIELD

This generally relates to photovoltaic systems, and in particular building-integrated photovoltaic roof tile systems.

BACKGROUND

Solar is becoming increasingly popular in the United States and abroad, but penetration remains relatively low versus the number of homes that could benefit from solar. The price per kilowatt for solar is now competitive with or below that of fossil fuel-based utility power in most areas, however, solar largely remains a niche product for those who value saving money, reducing $CO_2$ emissions, or both.

One factor that may limit the adoption of solar technology is aesthetics. Most residential solar systems are installed as modules over an existing tile or composition shingle roof. The solar array, which often only covers a portion of the roof, or even a portion of one mounting plane on the roof, stands out as separate and distinct from the existing roof, both in height and material. This structure is therefore visible even from the street level and over large distances.

Another obstacle to solar adoption in existing homes is the dissonance between the age of the existing roof and the solar system, particularly where the existing roof is made from composition shingles. The expected life of a solar system can be 25 years or more, and the expected life of a composition shingle roof is also about 25 years, depending on the local climate and specific tile materials, however, at the time a customer is considering going solar, their existing roof may be several years, if not decades, into that lifespan. So the customer may be presented with the dilemma of getting a new roof first, increasing the cost of going solar, or installing a 25+ year solar system on a roof which may have a relatively shorter remaining operational lifespan.

Accordingly, there is a need to resolve the dissonance between the expected life of the solar system and the remaining life of the roof, and for photovoltaic systems that blend in more aesthetically with the complete roof surface or at least the mounting plane, and that do not require the prospective customer to pay for a new roof and a new solar system installed on top.

BRIEF SUMMARY

Building integrated photovoltaic systems utilizing glass solar roof tiles are described herein. Such solar roof tiles allow for improved aesthetics that more closely resemble conventional tiled or shingled roofs and allow the system to replace much of the conventional roof surface structure. In addition, some aspects allow for improved efficiency, ease of installation and manufacturing. These and other embodiments are discussed in greater detail in the detailed description and drawing figures.

In one aspect, the invention provides a photovoltaic (PV) roof tile that includes one or more solar cells, a planar glass member overlaying the one or more solar cells, and a substrate supporting the one or more solar cells within a cavity and affixed to the planar glass member so as to encase or encapsulate the one or more solar cells therein. Each PV roof tile further includes electrical contacts that are electrically coupled with the one or more solar cells and are accessible from an exterior of the planar glass member and substrate affixed thereto. In some embodiments, the electrical contacts are disposed within a connector disposed along an up-roof portion of the PV roof tile that is configured to be accessible from an up-roof direction for connection with a corresponding connector when the respective PV roof tile is mounted on or within the roof. In some aspects, mounting on the roof can entail placement or mounting on a roof substrate and/or mounting of the PV roof tiles on battens or cross battens. Typically, the up-roof portion having the connector would reside beneath an adjacent up-roof course of PV roof tiles or ridge cap tiles when installed within the roof assembly. In some such embodiments, the PV roof tiles lack any electrical connector on the lateral side portions and/or underside of the PV roof tiles, which further improves ease of installation and weatherproof engagement between laterally adjacent PV tiles within a course. Such embodiments can include an electrical cable or harness electrically coupling adjacent PV roof tiles within a string via the above-described connectors. The cable or harness can reside above each course of PV roof tiles underneath the adjacent up-roof course of shingles or cap tiles along a ridge. In some embodiments, each PV roof tile includes a lapped region along one lateral side dimensioned to underlie an adjacent PV roof tile when installed within a course. Each PV roof tile may further include a textured surface, such as ridges or striations, on or under the top glass surface, that visually obscure the underlying solar cells. In one aspect, the texture is defined so that the one or more solar cells encapsulated within the PV roof tile are visually obscured, either partly or fully, when viewed from a non-normal (e.g. less than or greater than 90 degrees) viewing angle.

In another aspect, each PV roof tile includes wire bussing electrically connected to the one or more solar cells and extending to the electrical contacts. Each PV roof tile includes an up-roof portion over which an up-roof course of like PV roof tiles are overlaid when mounted in a solar roof tile assembly, and a down-roof portion in which the one or more solar cells are disposed and that remains exposed when mounted in the solar roof tile assembly. This portion may be referred to as the "reveal portion." In some embodiments, electrical contacts are disposed within one or more connector portions in the up-roof portion of the PV roof tile. The electrical contacts can be disposed in a connector along an up-roof edge of the PV roof tile and configured to electrically connect with a corresponding connector in a wiring harness, the harness extending adjacent the up-roof portions of adjacent solar roof tiles within a course.

In some embodiments, each PV roof tile includes a junction box or other electrical contact disposed on opposing lateral sides thereof, each being configured to electrically connect with a corresponding electrical contact on an adjacent solar roof tile in a solar roof tile assembly (e.g., V+ to V−, V− to V+). Such electrical contacts could include any of: exposed wires, metal tabs, a female connector, and a male connector.

In still other embodiments, each PV roof tile can include electrical contacts disposed in a connector portion on an on underside of the solar roof tile, each being configured to electrically connect with a busbar within a mounting track configured for mounting on a roof. Such embodiments can utilize any of various connectors that can both mechanically and electrically coupled PV roof tile to the busbar track, typically by inserting and twisting the connector into the track.

In another aspect, each PV roof tile includes one or more solar cells and a planar glass member overlaying the one or more solar cells, where the solar cells are encapsulated beneath the planar glass member by one or more underlayers. The one or more underlayers can include a first layer adjacent the one or more solar cells and a second layer underlying the first layer. The first and second layers can be the same or different materials. In some embodiments, the layers are made from ethylene vinyl acetate (EVA), in others, polyolefin or a polyvinyl material. Typically, both layers adjacent the cell are the same material.

In another aspect, building integrated photovoltaic systems are provided. Such systems can include PV roof tiles that are electrically connected together in a string when arranged within a first course on a roof surface. Such systems can further include a first wire bussing electrically connected to each of the PV roof tiles, and a first optimizer coupled with the wire bussing. In some embodiments, the first wire bussing between the first course of PV roof tiles is configured for carrying low voltage. The system can further include a high voltage wiring electrically connected to the optimizer for carrying a high voltage DC or a high voltage AC to a main panel of a building on which the system is installed. In some embodiments, the system includes a first plurality of PV roof tiles electrically connected by a first wire bussing connected to a first optimizer and a second plurality of PV roof tiles electrically connected by a second wire bussing connected to a second optimizer. In some such embodiments, the first and second pluralities of PV roof tiles can include first and second courses of PV roof tiles that overlap. In another aspect, the wire bussing can include a wiring harness having a number of taps for connecting to respective PV roof tiles of the plurality and terminating in the first optimizer. In some embodiments, the wire bussing can be defined as a busbar track. In some embodiments, the system can further includes a wiring harness having a number of taps and terminating in a DC optimizer, the number of taps limiting the aggregate voltage of all connected PV roof tiles to an amount less than 50 volts.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive.

DETAILED DESCRIPTION

Figure 1A:
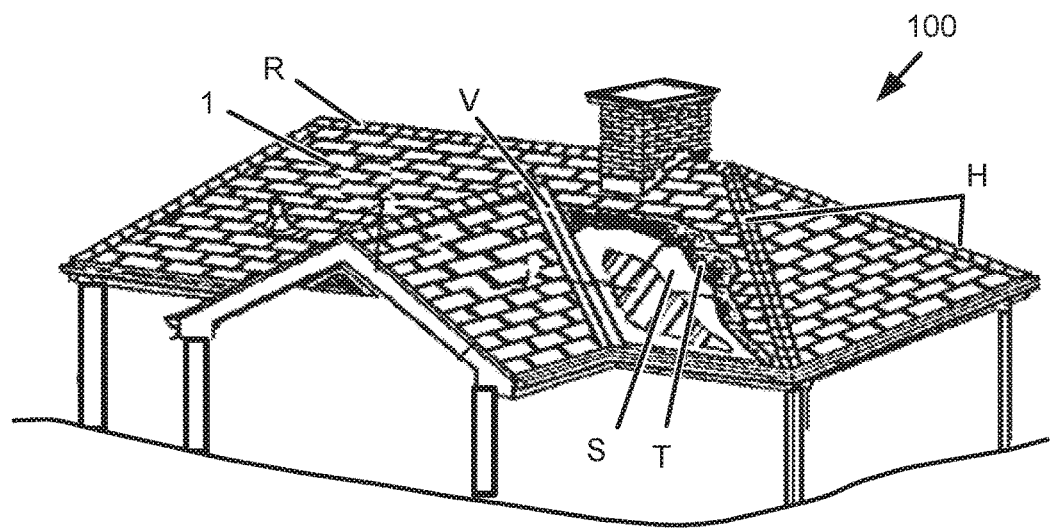
FIG. 1A shows an example of a BIPV system having PV roof tiles, according to some embodiments.

The present disclosure describes various embodiments of photovoltaic roofing systems, in particular PV roof tiles, systems and associated methods. Some embodiments relate to building integrated photovoltaic module assemblies and associated systems and methods. In various embodiments, the systems described herein lower costs of conventional systems in which a PV system is installed over a roof, and at the same time can provide an improved aesthetic for a PV roof system, and particularly a building integrated PV system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

Many of the details, dimensions, angles and other features shown in the figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the figures. Moreover, the various elements and features shown in the figures may not be drawn to scale. In the figures, identical reference numbers identify identical or at least generally similar elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be, for example, by ±5%, ±10%, ±15%, ±20%.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. Such building integrated photovoltaic structures can be alternatively referred to as building integrable photovoltaic ("BIP") or building applied photovoltaics ("BAPV"). Components of a BIPV system used, in part, as the actual building envelope (e.g., roofing membrane), can provide a watertight or substantially watertight seal for the roof surface. Alternatively, BIPV systems may merely look like they are part of the roof even through there are other roofing materials making up the building envelope installed below such BIPV systems.

For the sake of distinguishing between structural elements of the present BIPV system, as used herein, the terms "photovoltaic module", "PV module", and "solar cell" refer to the structures of the system with solar energy collecting elements, while the term "PV roof tile" refers to such solar collecting elements as mounted or adhered to, or located within a structural roof tile. Accordingly, as used herein, a "roof tile" refers to a structural element of a roof, which may or may not have PV elements attached thereto, depending on the context of the description.

As used herein, the terms "up-roof" and "down-roof" are used to provide orientation, direction, position, or a reference point relative to or in context of a roof or roofing surface upon which the systems described herein are installed on and/or form a portion of. Up-roof generally refers to an orientation that is relatively closer to the roof ridge while down-roof refers to an orientation that is relatively closer to the roof eave.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

Rapid shutdown devices ("RSD") for PV systems can be applied to the systems described herein, and can be located or positioned in various locations. In some embodiments, a recess or other opening can be made in structural support pans (e.g. a transition pan or a non-PV pan) through insulation such that RSD can be inset or positioned inside recessed opening. Vents can be positioned on top of opening to conceal or cover opening. Structural support pans can be elements of roofing frames or array systems that provide stability or integrity to the overall structures, as described in further detail below. RSD can be positioned within a box or other suitable container prior to positioning within recess. In other embodiments, RSD can be positioned under eaves, or eave flashings or gutters. In yet other embodiments, RSD can be positioned within attic portions of a building.

Generally, PV modules are made with crystalline-based solar cells, which can be either or both of monocrystalline cells or polycrystalline (multi-crystalline) cells. The laminate or wafer forming the solar energy-collecting surface of such PV modules can be mechanically coupled, adhered, or bonded to structurally supporting tiles. In some embodiments, PV modules can include layers of amorphous silicon or thin film variations of solar energy-collecting laminates, or thin-film solar materials directly applied as continuous sheets. Generally, PV roof tiles as considered herein, which can include PV modules, solar cells and laminates, have individual structures that can be used in combination to form larger solar arrays and/or building structures, as set forth below. Alternatively, thin-film PV modules, such as cadmium telluride, copper-indium-gallium-diselenide ("CIGS"), or amorphous thin-film silicon may be used. In still further embodiments, cells based on perovskite or other as of yet non-commercialized materials may be used. The particular type of cell technology used for any given installation can be selected both for solar energy collecting functionality and for aesthetic qualities, as related to the present disclosure.

For any given solar panel installation on the roof of a residential, commercial, or industrial building, there is a balance obtained between the power generation of the solar panel array, the visual appearance and aesthetic of the solar panel array, and the structural requirements for mounting or constructing the solar panel array. For BIPV installations as considered herein, the materials for forming the roof and the PV elements for collecting solar radiation are combined into a single unit, where the aesthetic of the solar panel array can be optimized while still maintaining a desired level of power collection and generation. However, not every surface, slope, or region of a roof may be amenable to, or need to be used for, solar energy generation. Thus, BIPV systems can also include "dummy" or "mimic" roof tiles or simply "roof tiles" that can include patterning or silicon elements that appear similar to the PV roof tiles, but do not collect solar radiation and are not electrically interconnected to each other or other PV system components.

PV elements that are distributed over all roof surfaces can have a visual uniformity that is neat, generally continuous, and elegant. Adjusting the density of PV element on a roof surface changes both the appearance of the overall roof and the energy production of the solar array on the roof, typically measured in kilowatts (kW) or kilowatt-hours (kWh). Accordingly, the density of PV elements can be adjusted to achieve a desired kilowatt-hour production goal while maintaining an even distribution of the PV elements with a consistent visual aesthetic. In some aspects, PV elements can be distributed on the surface of a roof in a randomized, semi-randomized, or non-regular pattern to achieve the aesthetically pleasing neat, generally continuous, and elegant appearance.

Tile Roof Building Integrated Photovoltaic Array

As discussed herein, solar cells that are integrated as part of roof tiles can be connected together and laid down so as to define the main surface of a roof, and in particular, a tile roof. By integrating solar cells into individual PV roof tiles, or clusters of PV roof tiles carrying solar cells so that the PV is part of the roof, advantages can be obtained in comparison to more traditional "on-roof" arrays that are elevated above the surface of a roof. For example, roof surfaces formed of PV roof tiles are directly built onto the framing structure of a roof can be lighter than on-roof installations, at least because the built-in BIPV solar array does not require a second structure above an existing roof. Further, a roof that is being replaced in a re-roofing installation can replace older or traditional roof tiles or with PV roof tiles, which can be more efficient in reducing the amount of materials needed for a re-roofing installation. Also, electrical connections, junction boxes, and wiring can be generally housed underneath PV roof tiles of BIPV assemblies, protecting such components from precipitation, wind, and excess heat, and further hiding such components from an observer so as to make the overall BIPV system visually attractive or uniform.

Makers of BIPV solar systems generally aspire to provide for an advantage over traditional on-roof PV systems by having a less drastic topological difference, thereby reducing visually noticeable differences in height on regions of the roof. However, previous implementations of BIPV systems do not necessarily provide for further visual qualities or design that effectively minimize noticeable differences between solar materials and standard roofing materials that form the overall PV system. Embodiments of the present disclosure provide for a BIPV system, with solar cells contained within individual roofing tiles and electrically connected in strings or other circuits, which is visually appealing at least in that the solar elements and roofing materials are combined and assembled in a layout that minimizes or camouflages the differences between the solar components and the standard construction materials.

One advantage of the present system is that the process of laying such PV roof tiles and making the necessary electrical connections between PV roof tiles is simpler than installing an entire tile or shingle roof and then installing solar over the roof. A BIPV roof tile roof as considered herein is mounted in generally the same manner as a standard tile roof, for example: securing and sealing underlayment or other sheathing to frame elements of the roof, adding battens as needed to portions of the roof frame, installing tiles to form the main surface of the roof, working around obstacles (e.g., chimneys, skylights, vents, etc.) as needed, and installing ridge and edge tiles in combination with flashing or other trim structures of the roof. In the present system, the roof tiles must have a structural integrity capable of accommodating and supporting PV elements on the tiles, in terms of weight, heat generated, ability to connect electronics, and retaining strength to serve as a portion of a roof surface. The tiles used can be of standard sizes as known in the industry. Further, tiles used for systems considered herein can have a wide range of colors to match or blend with PV elements, including, but not limited to, blue, blacks, grays, browns, and clay colorations.

FIG. 1A shows exemplary BIPV system 100 installed as part of a roof surface. BIPV system 100 is composed of PV roof tiles 1 laid in horizontal rows or courses on the roof surface. Vertically adjacent courses of PV roof tiles 1 are offset from each other by about half the width of each roof tile 1, such that seams or breaks between two vertically adjacent rows of roof tiles 1 do not form a single seam or break along the full slope of roof surface. PV roof tiles 1 can be installed on the major planar faces of the roof as well as minor planar faces, such as the gable shown in FIG. 1A. While PV roof tiles 1 described herein allow solar cells to be installed on an increased surface area of the roof, as compared to conventional over-roof solar approaches, there are typically some areas where PV roof tiles cannot be installed, such as at the ridge R, the hips H and the valleys V of the roof. In these areas, system 100 may incorporate use of "dummy" tiles or basic roof tiles that resemble and ideally match PV roof tiles 1 in appearance to create a more uniform consistent appearance of the roof. These non-PV areas can be utilized for other purposes such as to cover electrical components of the PV power generation system or to cover a power harness or return cables extending from each string of PV tiles.

As shown in FIG. 1A, PV roof tiles 1 are each defined in a rectangular shape so as to resemble conventional shingled or tiled roofs. It is appreciated that such tiles can be formed in various other shapes including, but not limited to: rectangular, square, club, step, bullnose, fishtail, arrow, curved, or irregular shapes, and may consist of more than one tile section and more than two solar cells 30. Generally, roof tiles considered for use herein are flat tiles for forming roofing structures, but in other embodiments roof tiles can include, but are not limited to: curved tiles, barrel tiles, s-shaped tiles, Spanish tiles, tiles shaped for the edges of a roof, or tiles shaped to interlock with adjacent tiles, or any other desired shape.

PV roof tiles 1 described herein include a layer of glass overlaying one or more solar cells, which are encased by a substrate made of glass or other suitable material and/or one or more backing layers. The layers of glass can be stamped tiles that are stamped to define one or more features or contours that facilitate assembly of the tile or to provide improved aesthetics. For example, the glass can be stamped to define a lapping region that interfaces with an adjacent tiles in a course, or to define a cavity for receiving the solar cells. An outwardly facing surface of the top glass tile can also be stamped to form a pattern or texture, such as ridges or striations, that further obscure visibility of any solar cells encased within and to provide improved aesthetics of the roof installed system 100. In some embodiments, stamped tiles are formed to have a size and weight similar to roof shingles.

While PV roof tiles 1 are described herein as being formed of glass with one or more encapsulated solar cells, it is appreciated that there are different types of PV roof tiles that can be used in any of the configurations described herein. For example, such roof tiles can also be made of various other materials, such as stone, quartz, slate, granite, ceramics, concrete, porcelain, rigid shingle, clay, onyx, or replica materials for the same.

Figure 1B:
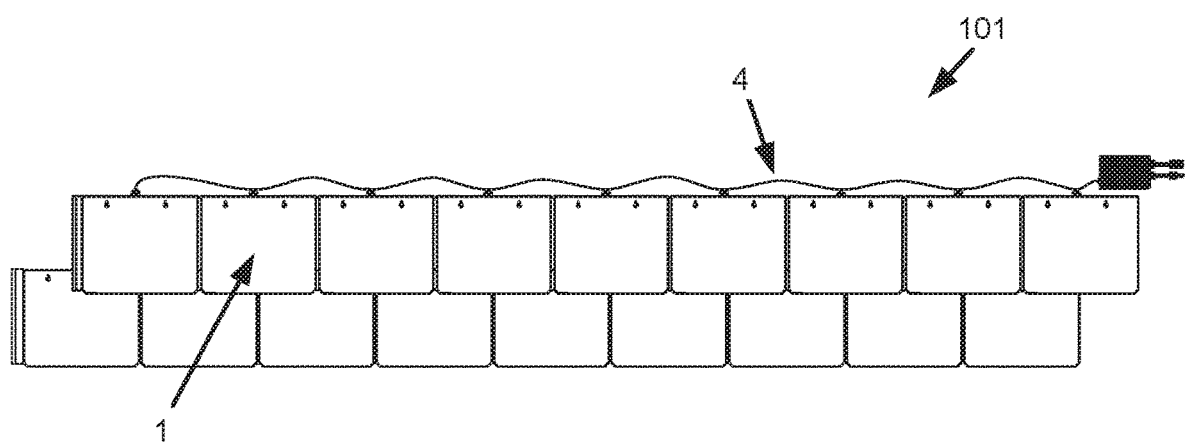
FIG. 1B shows a detail view of two courses of PV roof tiles electrically connected with a power harness, according to some embodiments.

FIG. 1B shows two photovoltaic tile courses 101, which are horizontal rows of PV roof tiles 1, each course electrically connected in a string by a power optimizing harness 4. As can be seen, each photovoltaic tile 1 includes an up-roof portion that is mounted to the roof and a down-roof portion in which the one or more solar cells are incorporated. As can be seen, the up-roof portion of photovoltaic tile 1 is covered by the next up-roof course, which leaves a gap (not shown) in which wire bussing/power harness 4 for each course can reside and remain protected from dirt and debris. In this embodiment, each PV roof tile 1 further includes a lapped region along at least one lateral side, which underlays the adjacent tile. This feature interleaves adjacent PV roof tiles 1 allows system 100 to function as a traditional roof in shedding water, which allows system 100 to entirely replace conventional tiles or shingles. It should be appreciated that although shown and described as individual tiles, each PV roof tile 1 may consist of two or more individual tile sections integrally formed as an N-tile module where N is an integer equal to two or more. In such a case, the solar cells contained within each tile section will include internal bussing so that the N-tile module can function in the same way as a conventional PV module with a V+ and V− terminal at each end from left to right. These N-tile modules may simply connect to one other to a harness 4 via a single two-wire connection.

Other aspects of the roof surface can interface with BIPV system 100 to provide further improvements in performance and aesthetics. For example, ridge flashing can include a ridge cap at the top of the resultant BIPV array that is used for venting, heat dissipation, wire management, and to generally conceal and protect wires (e.g., conduits or cables) or other equipment (e.g., fans, vents, connectors, inverters, jumpers, home-run connections). Waterproofing components, such as liners or trim, can be set underneath or between PV roof tiles such that roof surface properly functions as a roof to prevent water from entering the structure of the building. BIPV system 100 can also include other roofing components (e.g., flashings, gutters, vents, caps, covers, trims), for example, at eave flashing, hips, valleys, or sides of the roof.

In various embodiments, PV roof tiles 1, and non-PV roof tiles, can mounted as part of roof surface with other structural components to form a roof envelope of a building. Moreover, as discussed in greater detail herein, PV roof tiles supporting or embedded with one or more solar cells can be specifically configured to accommodate electrical junction boxes, diodes or micro-inverters on each individual PV roof tile, located on the bottom surface (underside) of relevant roof tiles. Wiring, cables, and/or power buses to electrically connect PV roof tiles, and by extension solar cells on PV roof tiles, can string together a plurality of PV roof tiles. To avoid physical conflicts with underlying studs, rafters, joints, battens, buttresses, or other infrastructure of a roof, such electrical components can be attached to the underside of PV roof tiles in locations to avoid physical conflicts.

Figure 1C:
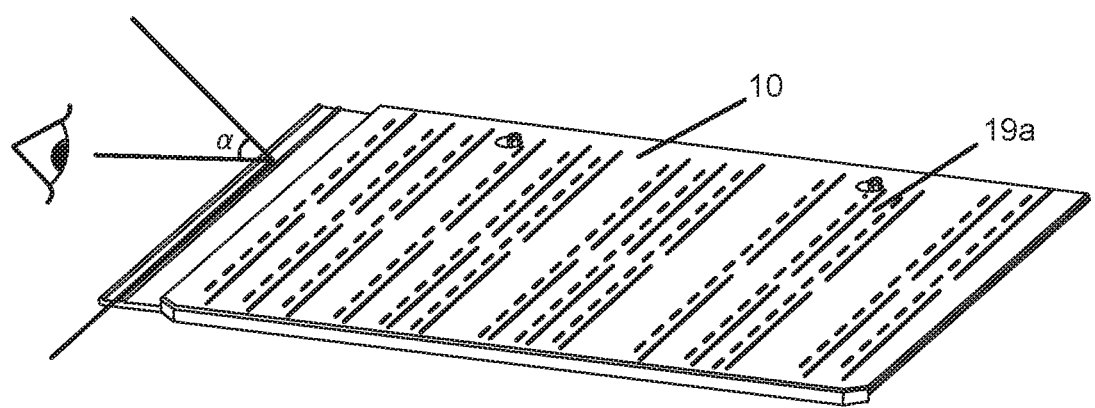
FIGS. 1C and 1D show examples of textured patterns in a top surface of a glass face of PV tile to obscure visibility of solar cells within when viewed at an angle, according to some embodiments.
Figure 1D:
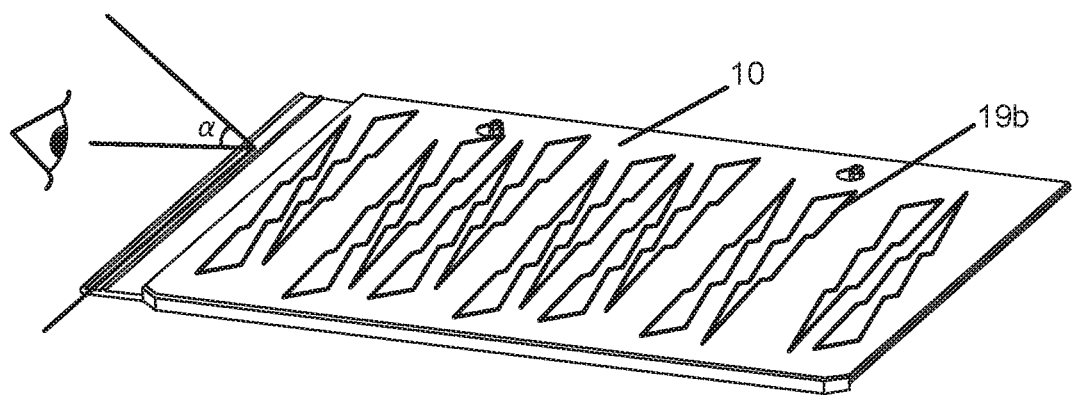

In one aspect, PV roof tiles 1 utilize top glass 10 having surfaces that are textured to obscure visibility of solar cells when viewed at non-normal angles such as angle (a). As shown in FIGS. 1C and 1D, top glass 10 of PV tiles 1 is textured with a striated or ridged pattern 19a or with an irregular pattern 19b, both of which can be defined to mimic the surface of materials associated with conventional roofing surfaces (e.g. tiles, shakes, slates, shingles). In some embodiments, the textured surface is designed to obscure visibility of solar cells encapsulated within PV tile, either partly or fully, when viewed at an angle less than or greater than normal (e.g. 90 degrees) from the surface of PV tile. In some embodiments, the textured surface is defined to substantially or fully obscure visibility of solar cells encased within PV tile when the viewing angle relative normal exceeds angle (a). In some embodiments, the textured design is defined for such an angle of 80, 70, 60, 50, 45, 30, 20, 15 or 10 degrees from normal. Typically, such textured surfaces are designed to be obscured when the viewing angle exceeds 45 degrees from normal. While textured patterns having ridges or striations and irregular shapes are shown here, it is appreciated that such textured surfaces could be defined in accordance with a variety of textures as desired in order to obscure solar cells encapsulated within respective PV tiles. Alternatively, smooth top glass may be used to achieve a more planar, monolithic visual effect.

Figure 2A:
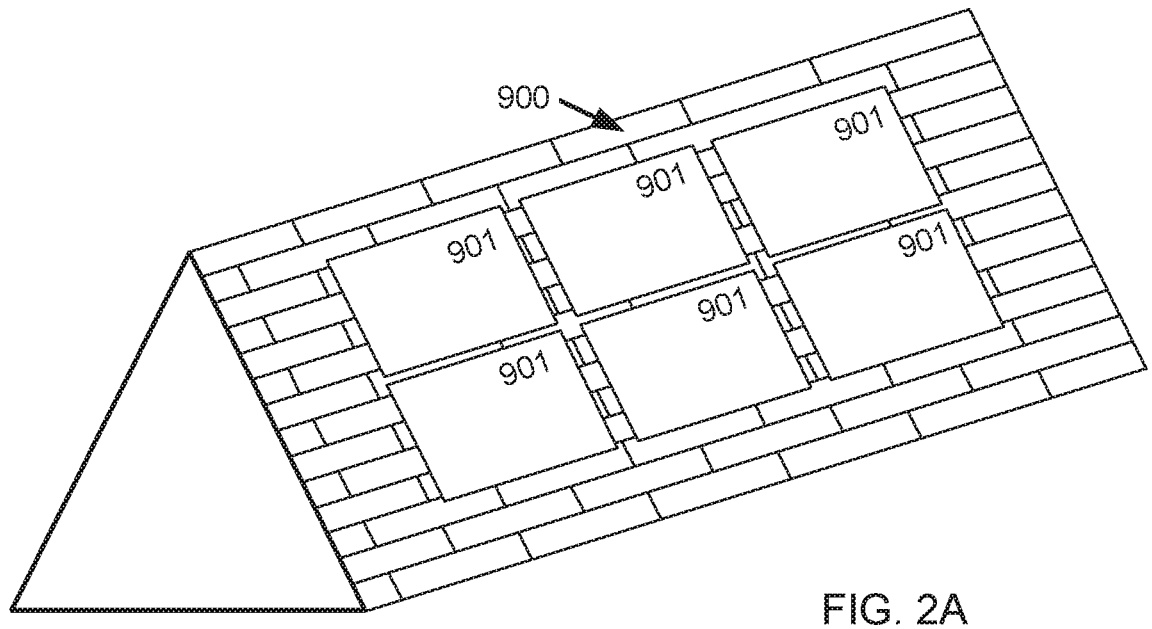
FIG. 2A shows conventional photovoltaic panels mounted on a roof.

In contrast with embodiments of the present disclosure, FIG. 2A shows a conventional PV array installed on pitched shingled roof. The conventional PV array of FIG. 2A includes six solar panels 901 or PV modules which, (though not shown in detail) are mounted on the roof using one of various known rail-based or rail-free mounting systems, as are currently employed by solar installers, such as San Mateo, Calif.-based SolarCity Corporation.

Figure 2B:
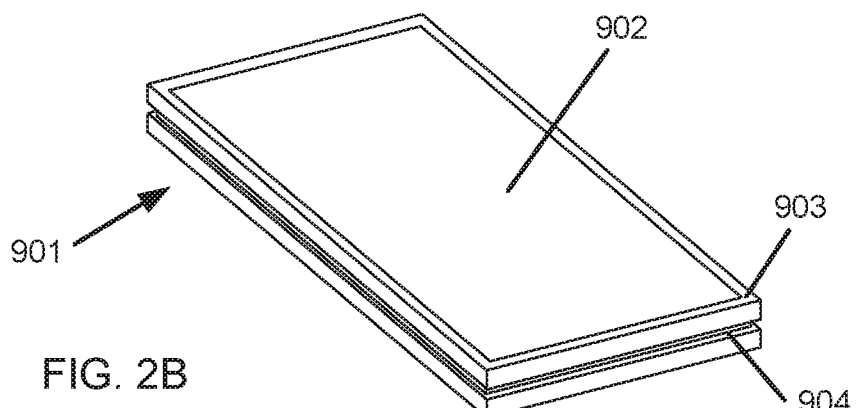
FIG. 2B shows a conventional photovoltaic panel.

FIG. 2B shows one type of conventional solar panel 901 in more detail. Solar panel 901 includes PV laminate 902, which with conventional silicon-based cells, consists of a silicon sandwich of p-doped and n-doped silicon layers, a top glass sheet protecting the laminate, and a back sheet that can include a plurality of layers—and rigid metal frame 103, supporting PV laminate 902. Although shown as a unitary structure, such a laminate 902 may include a plurality of individual solar cells that are wired together to form a single unit under the top glass sheet of PV roof tile 1. In the example shown in FIG. 1B, frame 903 is a grooved frame with groove 904 surrounding the outer face of frame 903 on all sides. Grooved frame modules such as module 901 are manufactured and sold by SolarCity Corporation of San Mateo, Calif. In such a module, groove 104 serves as mechanism for attaching other mounting hardware (e.g., a leveling foot, an interlock) to join modules together and to support the modules over a roof surface. Those of ordinary skill in the art will appreciate that panel 101 may also have a plain, non-grooved frame. Non-grooved frames are typically interconnected to one another and connected to the roof using connectors that clamp down between the top and bottom edges of the frame.

Although these types of framed PV modules achieve their structural function, they are aesthetically suboptimal and have material usage inefficiencies. First, conventional PV systems, such as that shown in FIG. 2A, are typically installed over an existing roof, and not as part of the existing roof, essentially requiring redundant structure since the PV array will shield most of the portion of the roof that it is installed over. Second, conventional systems are deemed by some people to be unappealing, having a choppy, discontinuous, and/or extraneous aesthetic. Conventional PV modules usually come in one of two colors: blue, signifying a poly-crystalline silicon structure, and black, signifying a mono-crystalline silicon or thin-film structure. The metal frame portion can be painted black to help it blend in with the roof surface, or it can simply be raw aluminum. Regardless of whether blue or black modules are used, the difference between the look of the portion of the roof that is covered with solar panels and the remainder of the roof is generally quite dramatic. This contrast can be particularly noticeable when a conventional PV array is mounted on a tile roof. As a result, roofs that are partially covered with solar panels have an aesthetic contrast that can be seen from very far distances due to the difference in reflectivity, elevation, height, and/or color between these two very different surfaces.

A string of PV roof tiles can be electrically connected together as a subset circuit of roof surface to have a specific or desired number of solar cells as part of the subset. Such subset circuits can have a specific number of solar cells to build to a desired voltage or kilowatt production. For example, a subset circuit of electrically connected PV roof tiles can have four (4) solar cells, six (6) solar cells, eight (8) solar cells, ten (10) solar cells, twelve (12) solar cells, or any integer number of solar cells within or around that numerical range. By extension, subset circuits can alternatively have more solar cells 206 to build to higher voltage and kilowatt levels, for example having 20-cell, 24-cell, 30-cell, 36-cell, 40-cell, 42-cell, 48-cell, 54-cell, 56-cell, 60-cell, 70-cell, 80-cell, or 92-cell embodiments. Further embodiments can have PV roof tiles with other number-of-solar-cell embodiments above, below, or within the above-considered increments. Typical PV modules have between 60 and 72 cells and are connected serially into strings having a combined voltage of up to 600 volts DC so depending on the number of solar cells in each PV roof tiles, they may be connected into subcircuits with additive voltages in the same range (i.e., <600 volts DC). The various embodiments of strings with different numbers of solar cells allows for flexibility in selecting PV roof tiles appropriate for any given system installation.

While such tiles could be installed on any planar roof surface, it is appreciated that it might not be desirable to install such tiles on every planar surface of a given roof. For example, on a given building, the South face of the roof may receive the most incident solar energy, while the North face may not receive sufficient sunlight to justify the additional cost of PV roof tiles (relative to non-PV roof tiles). To optimize the use of PV elements, solar tiles according to those described herein may be installed on a generally South facing roof, while roof tiles that are identical or similar in appearance but lack integrated solar cells may be installed on the North facing roof to create a consistent design aesthetic. Thus, both the South and North sides of roof surface will appear the same while overall costs of materials can be reduced by using non-PV roof tiles wherever energy production will be lowest. Likewise, for some roof surfaces, regions of roof surface may be occluded from consistent incident sunlight (e.g. due to shade from a tree), and accordingly, an occluded portion of roof surface can be covered with mimic PV roof tiles, in order to avoid wasted costs associated with installing PV roof tiles in the occluded portion of roof surface that will not generate power.

Various details of the PV roof tiles described above can be further understood by referring to the example PV roof tiles in the following figure descriptions.

Figure 3:
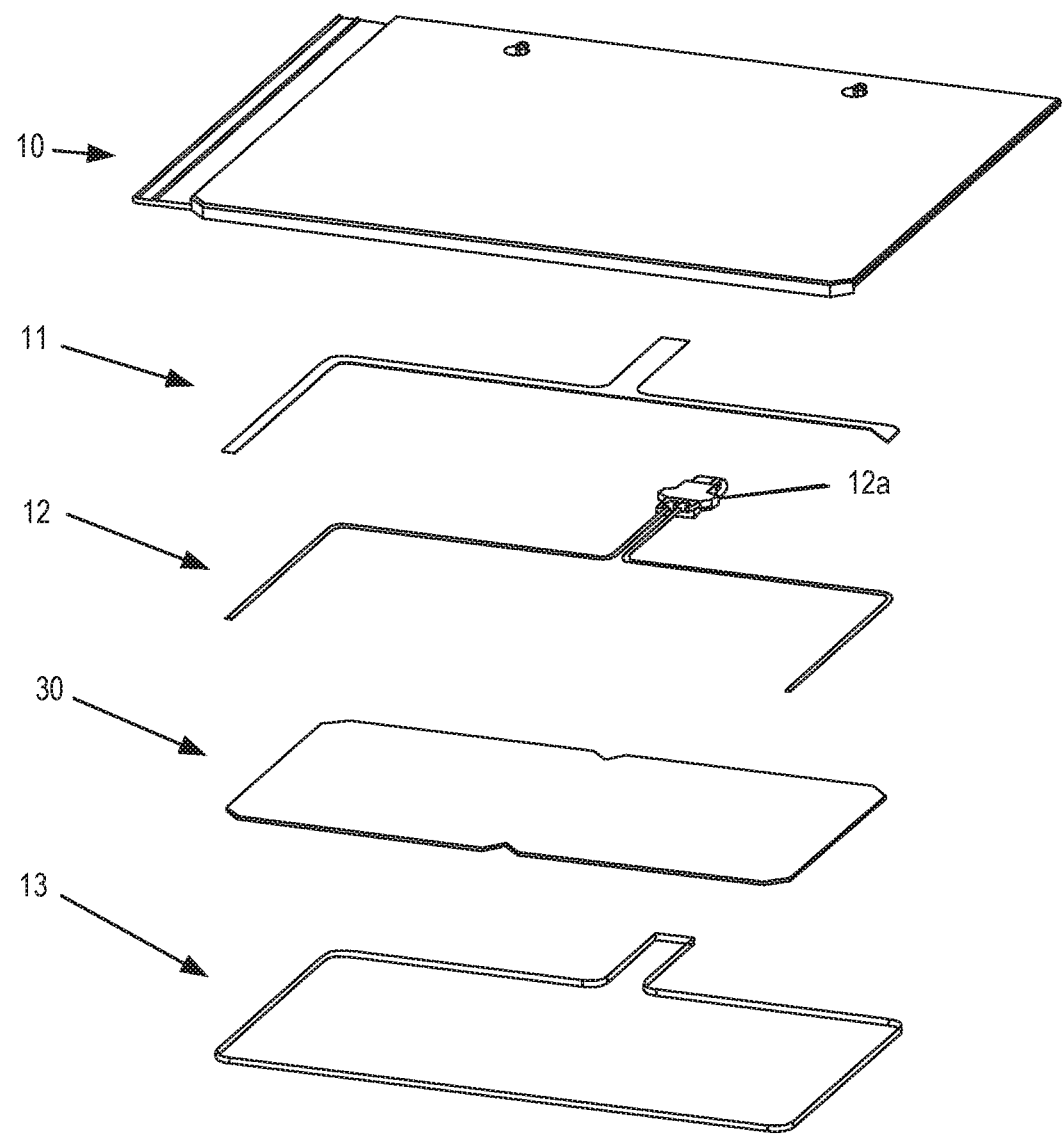
FIG. 3 shows an exploded view of a PV roof tile for use in a building integrated photovoltaic system, according to some embodiments.
Figure 4A:
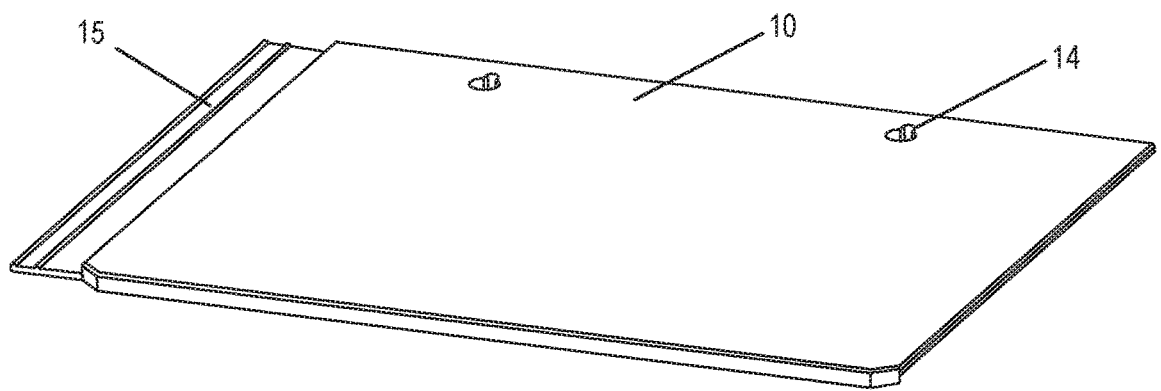
FIGS. 4A and 4B show detail views of a top glass tile and support substrate, respectively, of a PV roof tile, according to some embodiments.
Figure 4B:
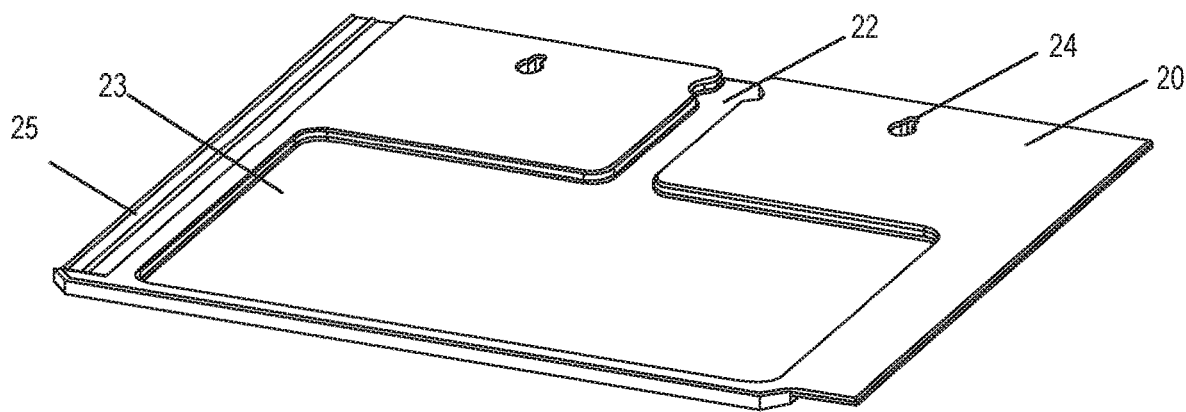

FIG. 3 and FIGS. 4A-4B depict exploded views of exemplary PV roof tile 1, which includes solar cell layer 30 (e.g. two solar cells) encased between top glass 10 and substrate 20 along with various other internal components to ensure that solar cell layer 30 remains encased within PV roof tile 1 while maintaining electrical connectivity from outside the PV roof tile 1 and to provide improved aesthetics. These internal components may include wire bussing 12 and connector 12a, silicone potting compound 13 surrounding solar cell layer 30, and masking 11 that overlays the wire bussing. Masking 11, potting compound 13, and/or substrate 20 can be painted with solar cell-matched paint to minimize contrast between solar cell layer 30 and surrounding components so as to further obscure the presence of the solar cells within PV roof tile 1.

FIG. 4A shows a detail view of exemplary top glass 10 for use in PV roof tile 1. Top glass 10 may include one or more fastener features in an up-roof portion to facilitate mounting of PV roof tile 1 to the roof. In this embodiment, the fastening features are defined as two hanger keyholes 14 for receiving a screw, nail, or other mechanical fastener. Top glass 10 may further include lapping feature 15 on one lateral side, which is dimensioned to underlay an adjacent PV roof tile 1 when installed in a course. These features can be formed in top glass 10 when stamped or can be formed by any suitable processing means. Top glass 10 can further include a pattern or texture (not shown) in the top surface, which can further obscure the visibility of solar cell layer 30 within PV roof tile 1. Typically, top glass 10 is formed of tempered glass although it should be appreciated that various other types of glass may be used.

FIG. 4B shows a detail view of substrate 20, which can be formed from the same glass material as top glass 10, a different type of glass (e.g. tinted, reinforced), or an entirely different material such as steel, aluminum, fiberglass, or metal alloy. The substrate can be stamped in a similar size and shape as top glass 10 so as to fit together with top glass 10. Substrate 20 may include one or more fastening features corresponding to those in top glass 10, such as two hanger keyholes 24, and a lapping recess 25 dimensioned to receive corresponding lapping feature 15. Top glass 10 and substrate 20 can be bonded, such as with an adhesive or potting compound, fused, or can fixedly secured together by any suitable means. Substrate 20 further includes cell cavity 23, which is dimensioned to contain one or more solar cells along with wire bussing attached to the solar cells and potting compound to encase the solar cell within. Substrate 20 further includes wiring channel 22 dimensioned to provide a passage for wire bussing 12 extending from solar cell 30 to a connector 12a accessible from an exterior of PV roof tile 1. Typically, connector portion 12a is defined along the top edge of the up-roof portion, however, in some embodiments, it would be disposed on a back side of PV roof tile or one or both edges. In some embodiments, some PV roof tiles may include multiple redundant connectors along different portions or edges so as to allow an interconnected string of PV roof tiles to change directions.

In some embodiments, solar cell layer 30 described herein refers to crystalline-type solar cells. However, solar cell layer 30 is not limited to crystalline-type solar cell technology. For example, in other embodiments, thin-film or amorphous solar (e.g., amorphous silicon) can be used as laminate layers with certain embodiments described herein. In yet further embodiments, hybrid crystalline and amorphous solar modules can be used with various systems described herein. In other embodiments, other types of solar cells (e.g., non-silicon based semiconductors, partial silicon, non-crystalline, partial crystalline, organic, carbon-based, perovskite, cadmium-telluride, CIGS, dye sensitized, transparent luminescent solar concentrator, polymer, transparent cells) can be provided as part of solar cell layer 30.

Figure 5A:
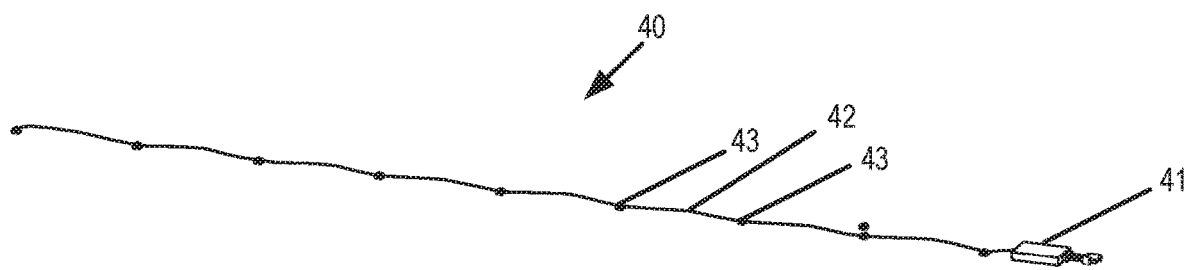
FIGS. 5A-5C show a power optimizer/wiring harness for use with a string of PV roof tiles, according to some embodiments.
Figure 5B:
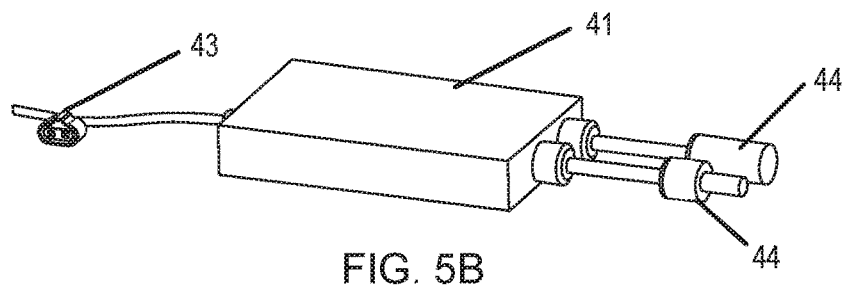
Figure 5C:
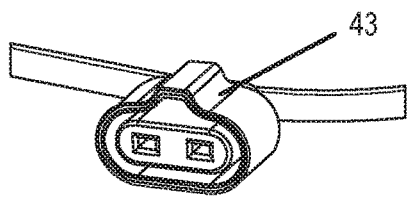

FIGS. 5A-5C illustrate an exemplary power harness 40 for electrically interconnecting a string of PV roof tiles 1 and carrying power to a main panel of the building on which PV roof tiles 1 are installed. Harness 40 includes a wire cable 42 having a series of connectors or taps 43 configured to connect with corresponding connectors 12a of each individual PV roof tile or PV roof tile module (N individual tile sections configured as an integral PV roof tile module) in a course. In some embodiments, connectors 43 are spaced apart sufficiently to allow pre-connecting of harness 40 to PV roof tiles 1 before installation. In such embodiments, it is desirable for the distance between connectors to be greater (e.g. 10%, 20%, 30%) than the required distance (e.g. distance between connectors 12a in adjacent PV roof tiles in a course) to allow the installer sufficient clearance to move and install the tiles or to install a subsequent tile connected along harness 40 in a subsequent course (e.g. up-roof or down-roof course). Harness 40 can further include sealed DC power optimizer box 41, which can be configured for low voltage maximum power point tracking (MPPT) and can optionally include a voltage boost and/or DC to AC power inverter. Such a configuration allows for harness 40 to be configured for low voltage, while the power optimizer 41 provides high voltage (DC or AC) at its output, which can then be carried to the main panel by high voltage pigtail cables 44. FIG. 5B shows a detail view of exemplary power optimizer box 41 and FIG. 5C shows a detail view of tile to harness connector 43. While in this embodiment, a female connector of a particular type is depicted, it is appreciated that connector 43 can utilize various other types of connectors or connections as desired.

Figure 6:
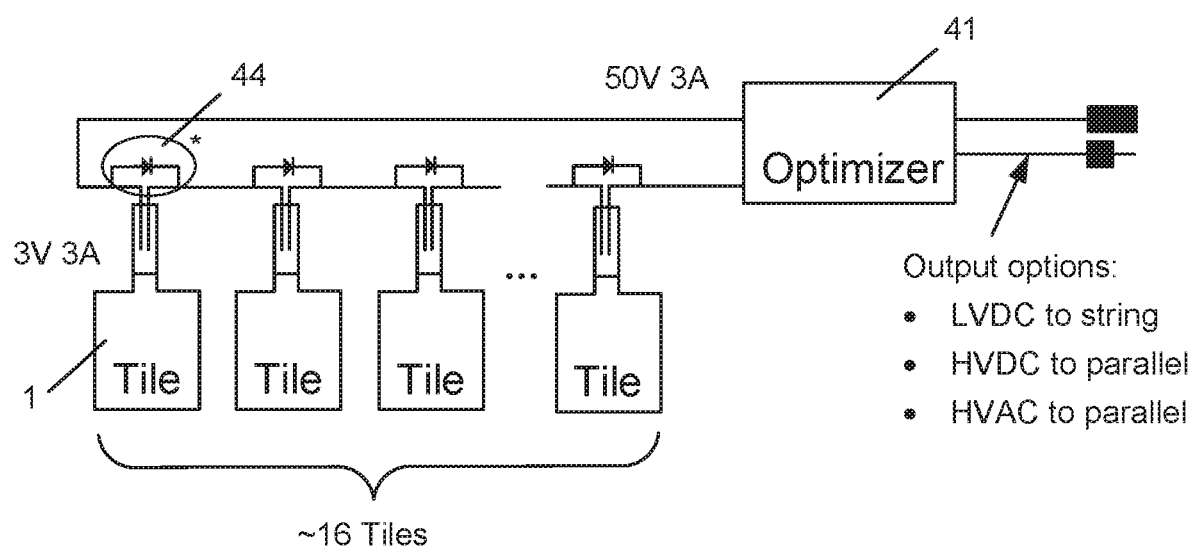
FIG. 6 shows a circuit diagram for wiring a string of PV roof tiles according to some embodiments.

FIG. 6 is a circuit diagram showing system 100 including individual PV roof tile 2 1 connected to harness 40 according to some embodiments. In various embodiments, a diode 44 can be provided for each PV roof tile 1 or can be included as needed.

Figure 7A:
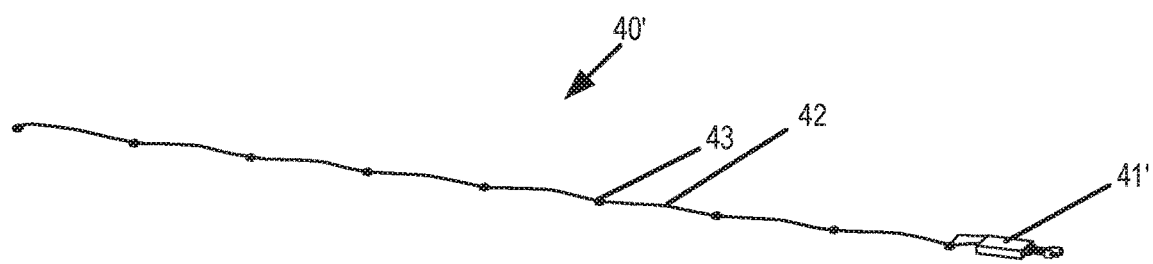
FIGS. 7A-7B show a custom power optimizer/wiring harness for use with a string of PV roof tiles, according to some embodiments.
Figure 7B:
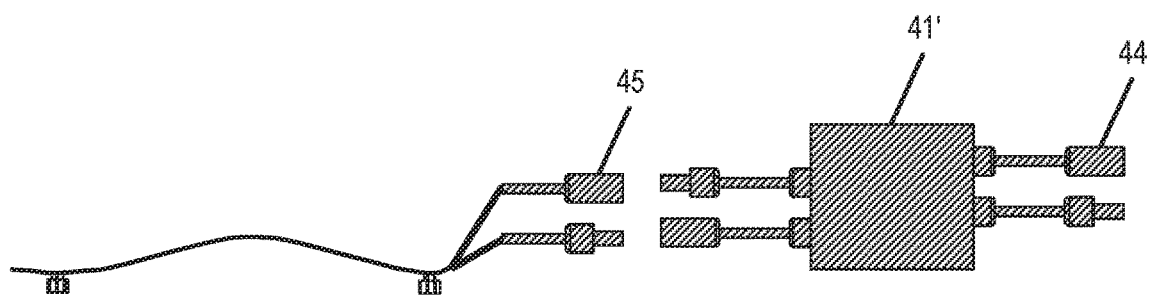

FIG. 7A shows an alternative embodiment of power optimizer harness 40' which allows for use of conventional OTS power optimizer box 41' suited for use in a high voltage line but used with a low voltage harness. This is made possible by a modified connector 45 that allows connection of a low voltage harness to two higher voltage connectors. This approach would allow for use of a wider range of readily available power optimization boxes that would normally not be suitable for use with a lower voltage application.

Figure 8A:
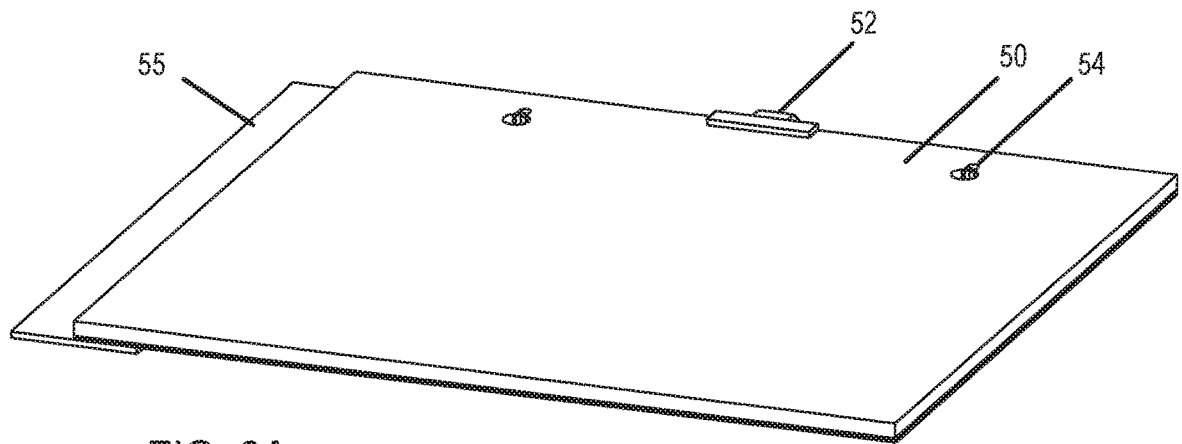
FIGS. 8A-8C show detail views of an alternative embodiment of a PV roof tile, according to some embodiments.
Figure 8B:
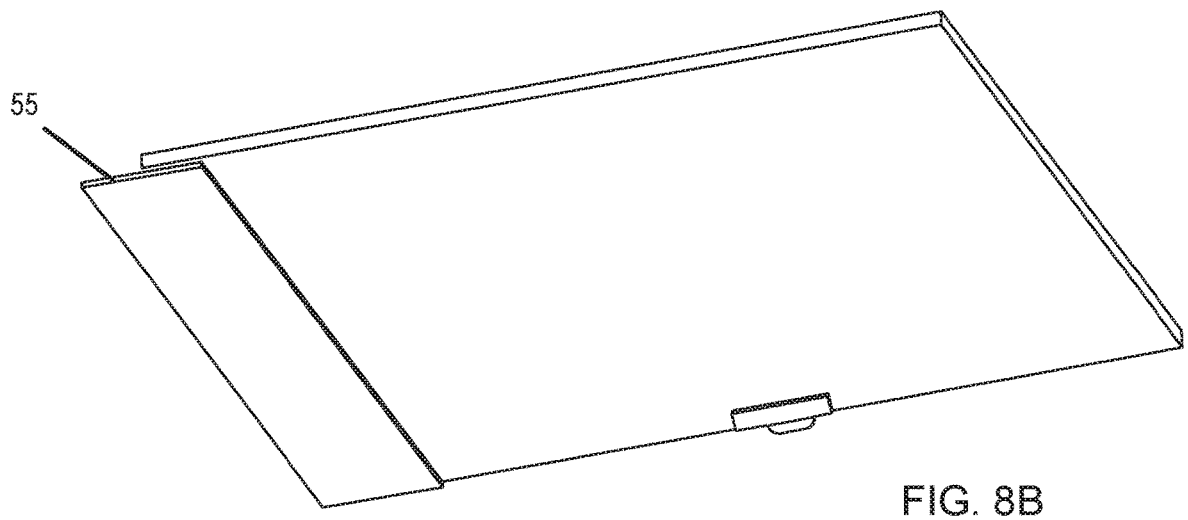
Figure 8C:
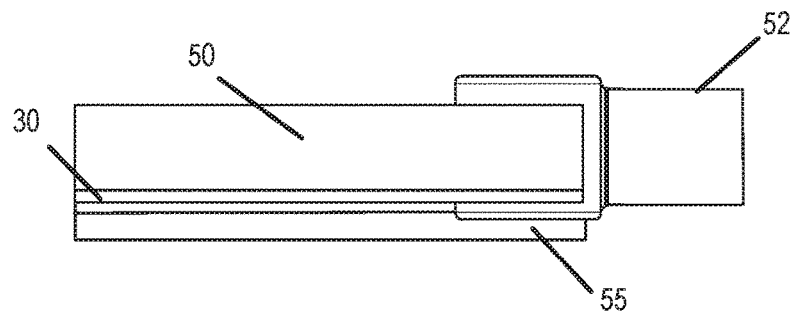
Figure 9:
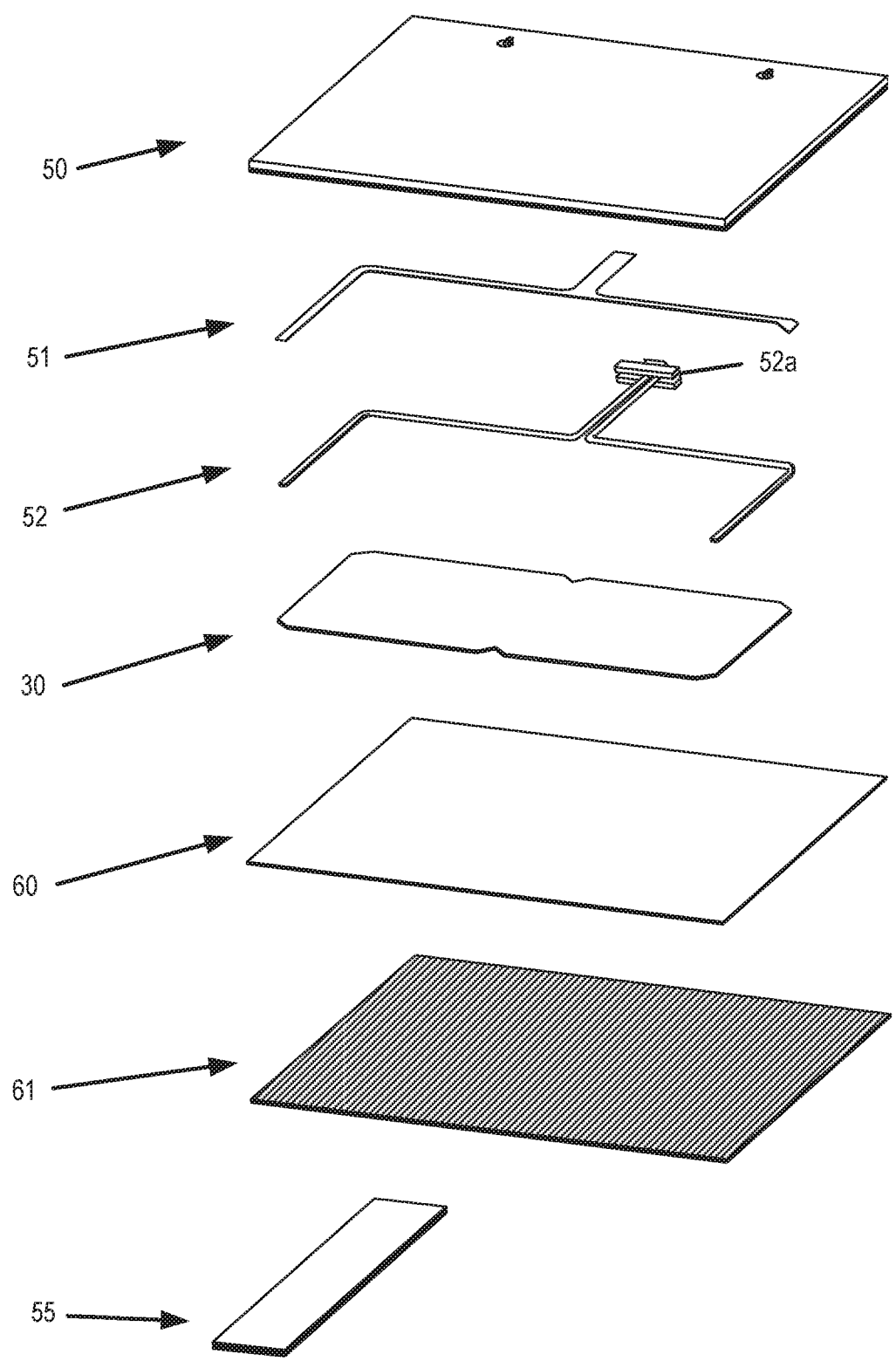
FIG. 9 shows an exploded view of the alternative PV roof tile embodiment shown in FIGS. 8A-8C.

FIGS. 8A-8C illustrate an alternative PV roof tile 1', which encases solar cell 30 beneath top glass 10 without use of a rigid substrate and without requiring use of stamped glass to form additional features (e.g. lapping region). Similar to the embodiment above and as can be seen in the exploded view of FIG. 9, this tile assembly includes glass tile 50, masking 51, wire bussing 52 and connector 52a, underlap member 55, solar cells 30, encapsulation layer 60 (e.g. ethylene-vinyl acetate (EVA)) and a backsheet layer 61 (e.g. polyvinyl fluoride film). These layers replace the rigid substrate of previous embodiments. It is appreciated that while EVA and polyvinyl fluoride films are described, various other types of materials, or combinations of materials could be used in a like manner. In some embodiment, backsheet layers can have a color, such as a non-white or dark color, to reduce glare and reduce contrast between solar cell 30 and underlying surfaces. It should be appreciated by those of ordinary skill in the art that although the PV roof tiles are shown throughout the figures as having only a pair of solar cells 30, such PV roof tiles 1 may consist of two, three or even more PV tiles clustered together into a single module containing 4, 6 or N solar cells, where N is an integer greater than 6. Such modifications are within the spirit and scope of the invention.

Figure 10:
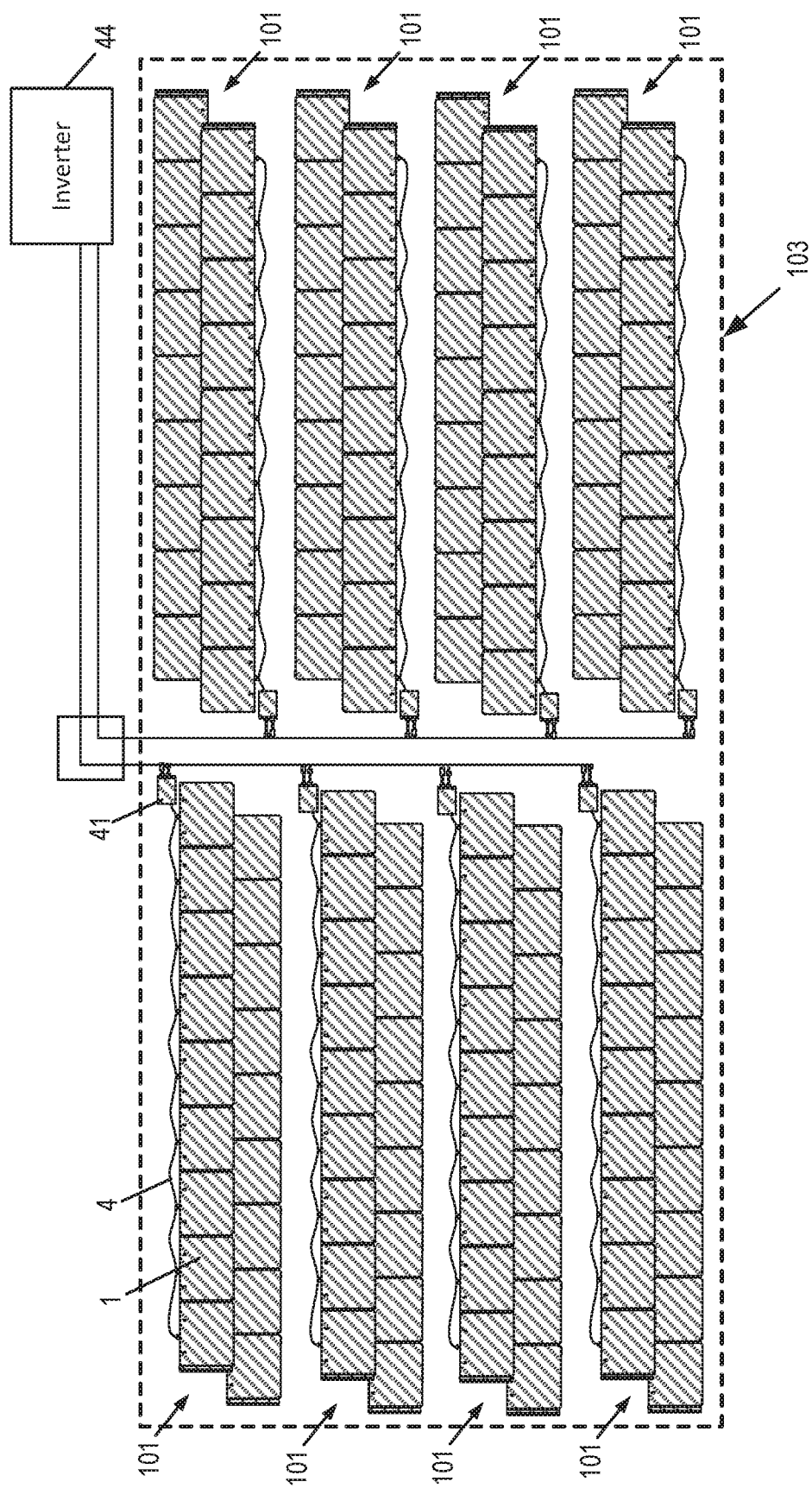
FIG. 10 shows a system having multiple courses of PV roof tiles electrically coupled with a central inverter, according to some embodiments.

FIG. 10 shows BIPV System 103 having multiple low voltage PV roof tile courses 101 electrically coupled to central inverter 44. One challenge associates with such systems is that optimizer input circuits must be rated the same voltage as the output circuits (i.e. full string voltage). One manner in which this can be dealt with is to use plastic casings and remove any grounded surfaces within the low voltage circuit area (indicated in dashed lines). Any transition or combiner box, wireways, or various other components outside the dashed border can have grounded metal parts. Thus, the inverter or any components carrying higher voltages can be located outside the low voltage PV roof tile area, such as on the ground or inside the building on which the PV system is installed. This avoids a high voltage rating for the PV roof tile area, thereby avoiding undue overregulation during installation.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

What is claimed is:

1. A photovoltaic roof tile comprising:
   a plurality of solar cells comprising a first solar cell disposed at a first end of the photovoltaic rooftile and a second solar cell disposed at a second end of the photovoltaic roof tile opposite the first end;
   a transparent member overlaying the plurality of solar cells;
   a substrate supporting the plurality of solar cells and affixed to the transparent member so as to encase the plurality of solar cells therebetween;
   a connector disposed along an up-roof portion of the photovoltaic roof tile that is configured to be accessible for connection with a corresponding connector from an up-roof direction when the photovoltaic roof tile is mounted on or within a roof and is accessible from an exterior of the photovoltaic roof tile; and
   a wire bussing comprising a first lead electrically coupling the connector to the first solar cell and a second lead electrically coupling the connector to the second solar cell.

2. The photovoltaic roof tile of claim 1, wherein the connector is on an underside of the solar roof tile, and electrically connected with a busbar within a mounting track configured for mounting on a roof.

3. The photovoltaic roof tile of claim 1, wherein the substrate supports the one or more solar cells within a cavity.

4. The photovoltaic roof tile of claim 1, wherein the transparent member is a planar transparent member.

5. The photovoltaic roof tile of claim 1, wherein the up-roof portion of the photovoltaic roof tiles is the portion of the roof tile configured to be positioned beneath an up-roof photovoltaic roof tile.

6. The photovoltaic roof tile of claim 3, wherein the connector comprises a plurality of electrical contacts.

7. The photovoltaic roof tile of claim 1, further comprising a lapped region on a lateral side of the substrate dimensioned to underlie an adjacent photovoltaic roof tile and is configured to prevent water from passing between the photovoltaic roof tile and the adjacent photovoltaic roof tile.

8. The photovoltaic roof tile of claim 1, wherein an outside surface of the transparent member has a pattern or texture that obscures visibility of the one or more solar cells.

9. The photovoltaic roof tile of claim 1, further comprising masking disposed between the wire bussing and the transparent member that overlays and conceals the wire bussing.

10. A building integrated photovoltaic system, comprising:
    a plurality of photovoltaic roof tiles electrically connected in a string when arranged within a course on a roof surface, each photovoltaic roof tile of the plurality of photovoltaic roof tiles comprising:
    a plurality of solar cells comprising a first solar cell disposed at a first end of the photovoltaic rooftile and a second solar cell disposed at a second end of the photovoltaic roof tile opposite the first end;
    a transparent member overlaying the plurality of solar cells;
    a substrate supporting the plurality of solar cells and affixed to the transparent member so as to encase the plurality of solar cells therebetween;
    a connector disposed along an up-roof portion of the photovoltaic roof tile that is configured to be accessible for connection with a corresponding connector from an up-roof direction when the photovoltaic roof tile is mounted on or within a roof and is accessible from an exterior of the photovoltaic roof tile; and
    a wire bussing comprising a first lead electrically coupling the connector to the first solar cell and a second lead electrically coupling the connector to the second solar cell.

11. The building integrated photovoltaic system of claim 10, further comprising an optimizer coupled with the wire bussing.

12. The building integrated photovoltaic system of claim 11, wherein the wire bussing between the plurality of photovoltaic roof tiles is configured for carrying low voltage, the system further including:

a high voltage wiring electrically connected to the optimizer for carrying a high voltage DC or a high voltage AC to a main panel of a building on which the system is installed.

13. The building integrated photovoltaic system of claim 10, wherein the wire bussing and the connectors of the plurality of photovoltaic roof tiles are configured such that at least some of the plurality of PV roof tiles are electrically connected within the string when arranged within another course down-roof of the course.

14. The building integrated photovoltaic system of claim 10, wherein the substrate supports the one or more solar cells within a cavity.

15. The building integrated photovoltaic system of claim 14, wherein the cavity includes a wiring channel dimensioned to provide a passage for the wire bussing.

16. The building integrated photovoltaic system of claim 15, wherein a first end of the wiring channel opens into a central portion of one side of the cavity.

17. The building integrated photovoltaic system of claim 16, wherein a second end of the wiring channel extends to an edge of the substrate.

18. The building integrated photovoltaic system of claim 10, wherein a first photovoltaic roof tile of the plurality of roof tiles comprises a lapped region positioned on a lateral side of the first photovoltaic roof tile that underlaps a second photovoltaic roof tile of the plurality of roof tiles.

19. The building integrated photovoltaic system of claim 10, wherein the transparent member of one of the photovoltaic roof tiles comprises an opening and the photovoltaic roof tile comprises a fastener extending through the transparent member securing the transparent member to the substrate of the photovoltaic roof tile.

* * * * *